United States Patent
Fairchild et al.

(10) Patent No.: US 9,025,276 B1
(45) Date of Patent: May 5, 2015

(54) SPACE EFFICIENT ENCLOSURES FOR DIFFERENT SIZED DRIVES

(71) Applicant: Western Digital Technologies, Inc., Irvine, CA (US)

(72) Inventors: Robert G. Fairchild, Tustin, CA (US); Steven T. Peng, Irvine, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 14/314,794

(22) Filed: Jun. 25, 2014

(51) Int. Cl.
  *G11B 33/14* (2006.01)
  *G11B 33/02* (2006.01)
  *G11B 33/12* (2006.01)

(52) U.S. Cl.
  CPC ............ *G11B 33/022* (2013.01); *G11B 33/126* (2013.01)

(58) Field of Classification Search
  CPC .... G11B 33/14; G11B 33/1486; G11B 19/20; G11B 19/2036
  USPC .......... 360/97.13, 97.12, 97.16, 97.19, 97.17, 360/97.14, 97.22
  See application file for complete search history.

(56) References Cited

U.S. PATENT DOCUMENTS

| | | |
|---|---|---|
| 7,215,206 B2 | 5/2007 | Dupuis et al. |
| 7,388,749 B1 | 6/2008 | Feroli et al. |
| 7,701,705 B1 | 4/2010 | Szeremeta |
| 7,864,519 B2 | 1/2011 | Lin et al. |
| 8,064,194 B2 | 11/2011 | Szeremeta |
| 8,113,873 B1 | 2/2012 | Sarraf |
| 8,133,426 B1 | 3/2012 | Yurchenco et al. |
| 8,358,395 B1 | 1/2013 | Szeremeta |
| 8,417,979 B2 | 4/2013 | Maroney |
| 8,462,460 B1 | 6/2013 | Szeremeta et al. |
| 8,498,088 B1 | 7/2013 | Klein |
| 8,547,658 B1 | 10/2013 | Szeremeta |
| 2002/0085358 A1* | 7/2002 | Homer et al. ................. 361/730 |
| 2012/0026668 A1 | 2/2012 | Landon |

* cited by examiner

*Primary Examiner* — Allen T Cao

(57) ABSTRACT

Systems and manufacturing methods are disclosed herein that can beneficially reduce manufacturing cost while providing size efficient enclosures to house hard drives or other types of storage drives. An enclosure system can be used for separately housing one of two storage devices having different thicknesses. A first portion can be interchangeable with both storage devices. Second and third portions can each have a thickness to size efficiently accommodate the thickness of one storage device. Each of the second and third portions has an engagement surface to engage the first portion forming an enclosure. Either the first portion, or both second and third portions can comprise an opening or a shock mounting element. When the opening or the shock mounting element are on both the second and third portions, the opening or the shock mounting element is collectively identically spaced from the engagement surface on both the second and third portions.

17 Claims, 8 Drawing Sheets

SPACE EFFICIENT ENCLOSURES FOR DIFFERENT SIZED DRIVES

BACKGROUND

A hard disk drive or hard drive (HDD) is a storage drive used for storing and retrieving digital information. Hard drives come in multiple data storage capacities generally resulting in different thicknesses. Hard drives of the same sized (diameter) disks typically increase in thickness as storage capacity increases. This is because disks are generally stacked on top of each other to increase capacity. At the same time, customers demand size efficient enclosures to house their hard drive. Current common disk sizes include 1.8 inches, 2.5 inches, and 3.5 inches, though other disk sizes can be used.

BRIEF DESCRIPTION OF THE DRAWINGS

Various embodiments are depicted in the accompanying drawings for illustrative purposes, and should in no way be interpreted as limiting the scope of the inventions.

DETAILED DESCRIPTION

Creating enclosures to hold each hard drive in the smallest possible form factor generally requires multiple sets of costly fabrication tools to accommodate the different thicknesses. Tooling is expensive and therefore multiple sets of tools burden the final product with high dollar cost.

An alternative option is to create a one size fits all enclosure. In this option, the thickest hard drive controls the size of the enclosures for multiple capacities of hard drive with the same sized disks. This solution does not provide the best space efficient solution; however, it only requires one set of fabrication tools. This solution offers the best product fabrication cost but sacrifices space efficiency.

Improved systems and manufacturing methods are disclosed herein that can beneficially reduce manufacturing cost while providing size efficient enclosures to house hard drives or other types of storage drives. A common datum plane "D" across a plurality of different capacity and/or thickness hard disk drives of the same size disks can be used to create a common enclosure part. In this way, the enclosure can be the smallest enclosure thickness while decreasing the amount of tooling cost. It will be understood that the concepts described herein can be employed for other uses and with other devices, including, but not limited to, other types of storage drives, computers, and all types of sensitive electronic devices. For example, the method and system may also be used with solid-state drives (SSD) and solid-state hybrid drives (SSHD).

Figure 1:
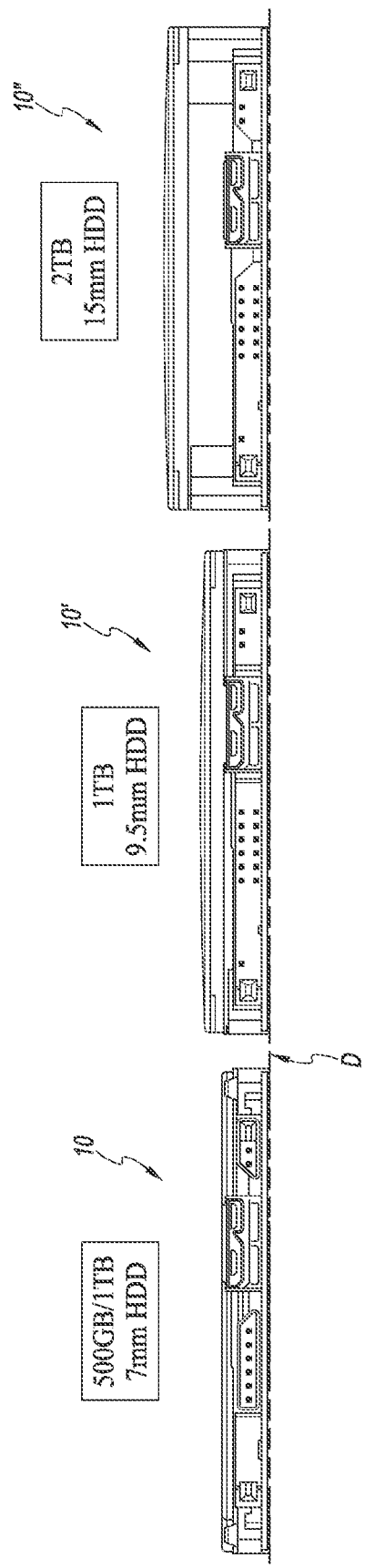
FIG. 1 shows three hard disk drives of varying thickness.

Three hard disk drives 10, 10', 10" of varying thickness are shown in FIG. 1. The different thickness hard drives can each have a common datum plane "D" from which other features of the hard drive are commonly positioned. The illustrated three hard disk drives include a first hard disk 10 having a thickness of 7 mm and a storage capacity of either 500 GB or 1 TB, a second hard disk 10' having a thickness of 9.5 mm and a storage capacity of 1 TB, and a third hard disk 10" having a thickness of 15 mm and a storage capacity of 2 TB. All three of the hard disks have the same diameter disks, though this is not required. Hard disks with other thicknesses and capacities can also be used.

Figure 2:
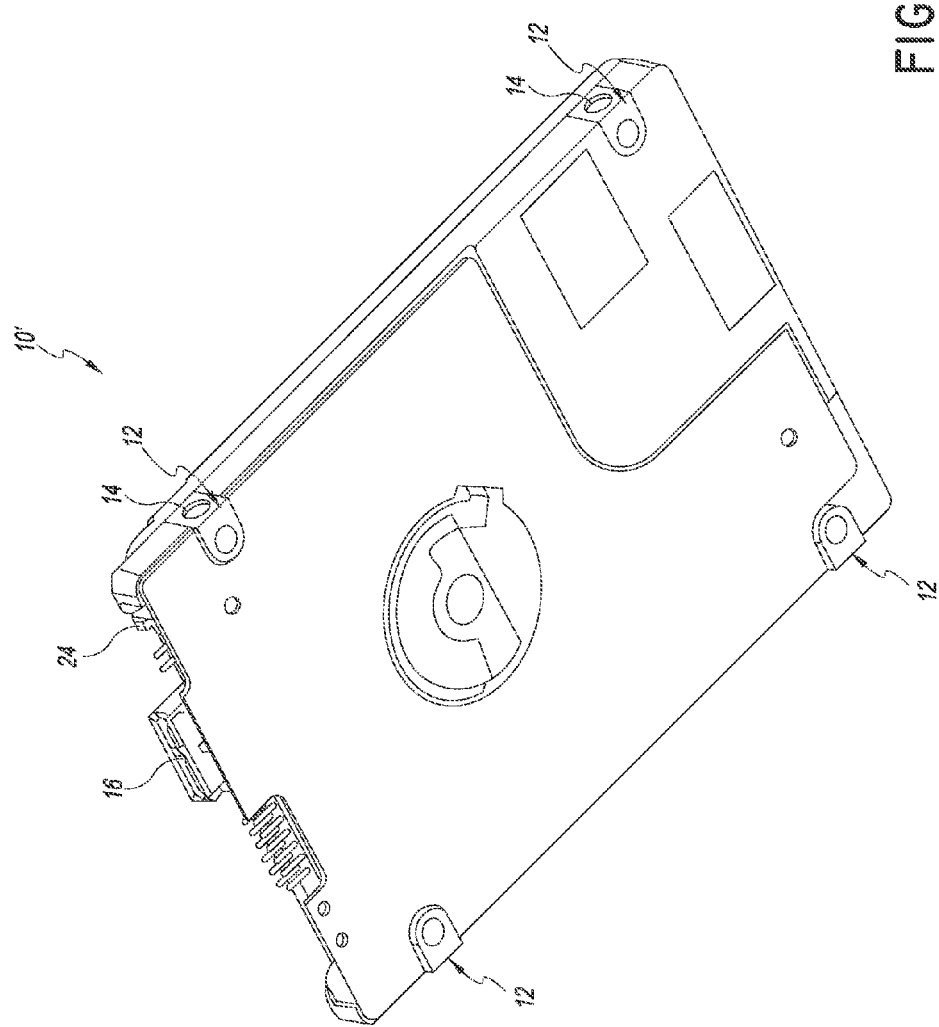
FIG. 2 is an example hard disk drive with reference surfaces.

The common datum plane can be established by reference surfaces 12 as shown in FIG. 2. The reference surfaces can be part of a frame of the hard drive, to which the circuit board, rotating disks and other components can be attached. The reference surfaces can be machined to ensure a high standard of precision in their relative placement with respect to one another.

When assembling a hard drive, a common datum plane, established by the reference surfaces 12, can be used as a reference to position components on the hard drive. The datum plane is commonly referred to as the bottom of the hard drive.

Figure 3:
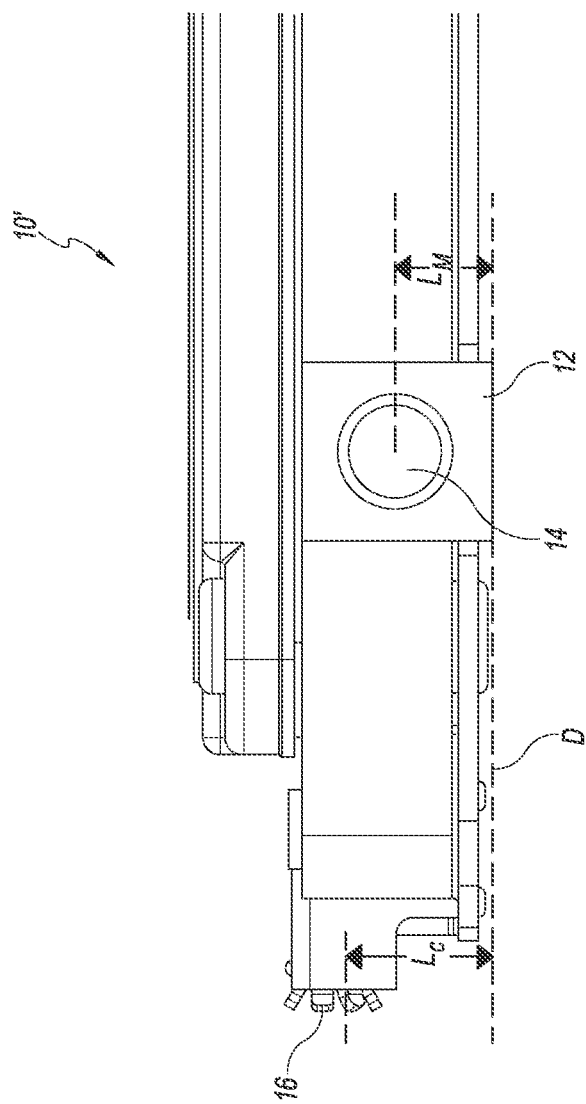
FIG. 3 illustrates placement of components with respect to a datum plane.

These positioned components can include mounting holes 14, electrical connectors (USB port, Serial ATA (SATA), etc.) 16, and/or indicator lights 24, among other features. As shown in FIG. 3, the position of an electrical connector 16, in the form of a USB port, and the position of a mounting hole 14 are both made with reference to the datum plane "D". The center of the USB port 16 can be positioned a length "$L_C$" above the datum plane. Likewise, the center of the mounting hole 14 can be positioned a length "$L_M$" above the datum plane. These features can be positioned in this manner across a number of different capacity hard drives to ensure repeatable and predictable placement of the various components.

Figure 4:
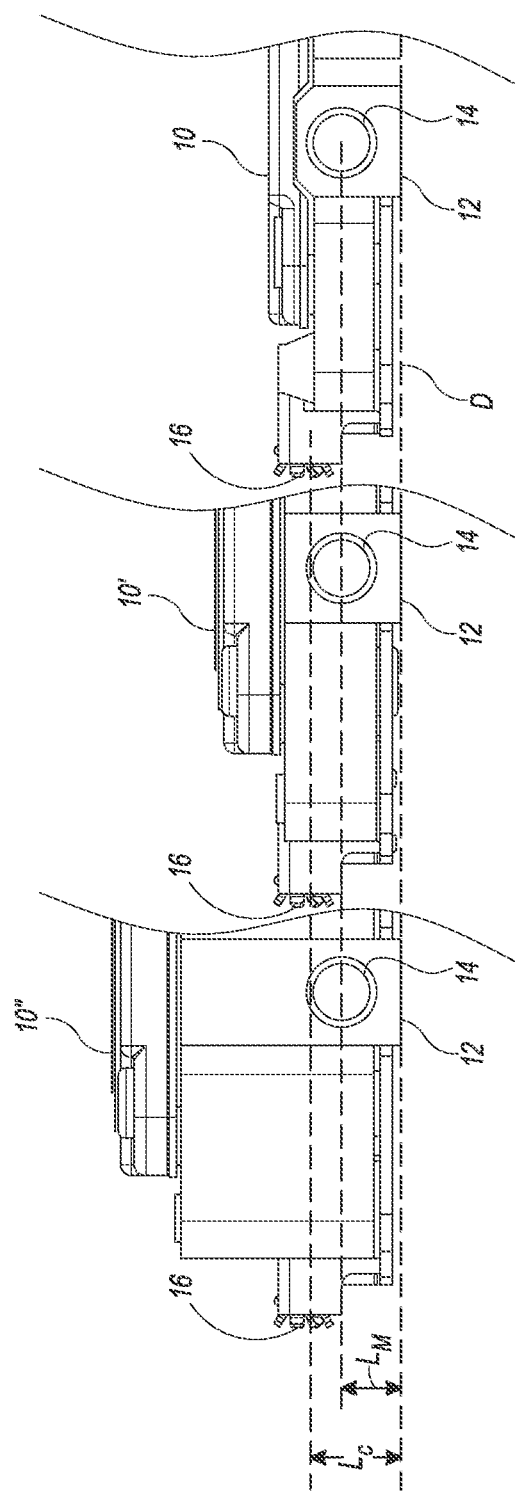
FIG. 4 illustrates a common datum and common component placement across differing capacity and/or thickness hard disk drives.

For example, all 2.5 inch hard drives, independent of the storage capacity and thickness, can have the same dimensions between the datum plane and the referenced components, such as between the datum plane and the USB port ("$L_C$") and between the datum plane and the mounting holes ("$L_M$"). This is illustrated in FIG. 4 with three hard drives 10, 10', 10" of differing thickness.

An enclosure system for different capacity and/or thickness hard disk drives can include a common enclosure part. The common enclosure part can utilize the common datum plane across the different hard disk drives. One or more additional parts can connect to the common enclosure part to form the enclosure. These additional parts may vary in size depending on the hard drive capacity and/or thickness to ensure the smallest, most efficient sized enclosure is provided.

The common enclosure part is preferably either the top or the bottom of the enclosure, though it may also be a middle part of the enclosure. The common enclosure part can engage the common datum plane or otherwise be precisely placed with respect to the common datum plane.

Figure 5:
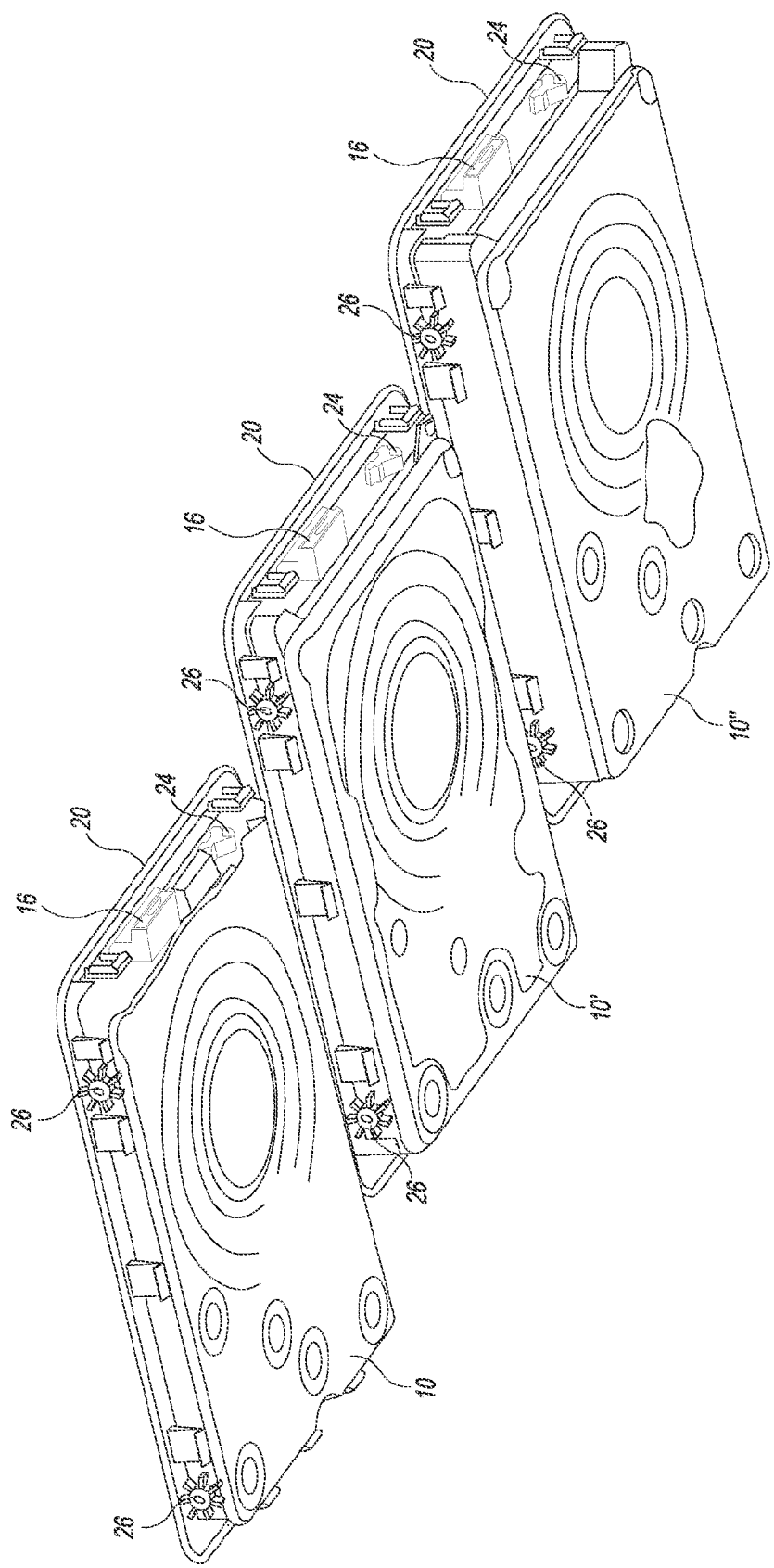
FIG. 5 illustrates a common enclosure part placed with reference to the common datum plane on differing capacity and/or thickness hard disk drives.

As shown in FIG. 5, a common enclosure part 20 can be a common cover or lid for the enclosure. The common cover 20 can be part of a two piece enclosure such as those illustrated in FIGS. 6 and 7. As can be seen, the common cover 20 can be used on each of the three different hard drives 10, 10', 10". A unique bottom part 22, 22', 22", such as the illustrated bottom tub-shaped part can be size efficient—sized to fit each corresponding hard drive of a particular capacity and/or thickness.

Figure 6:
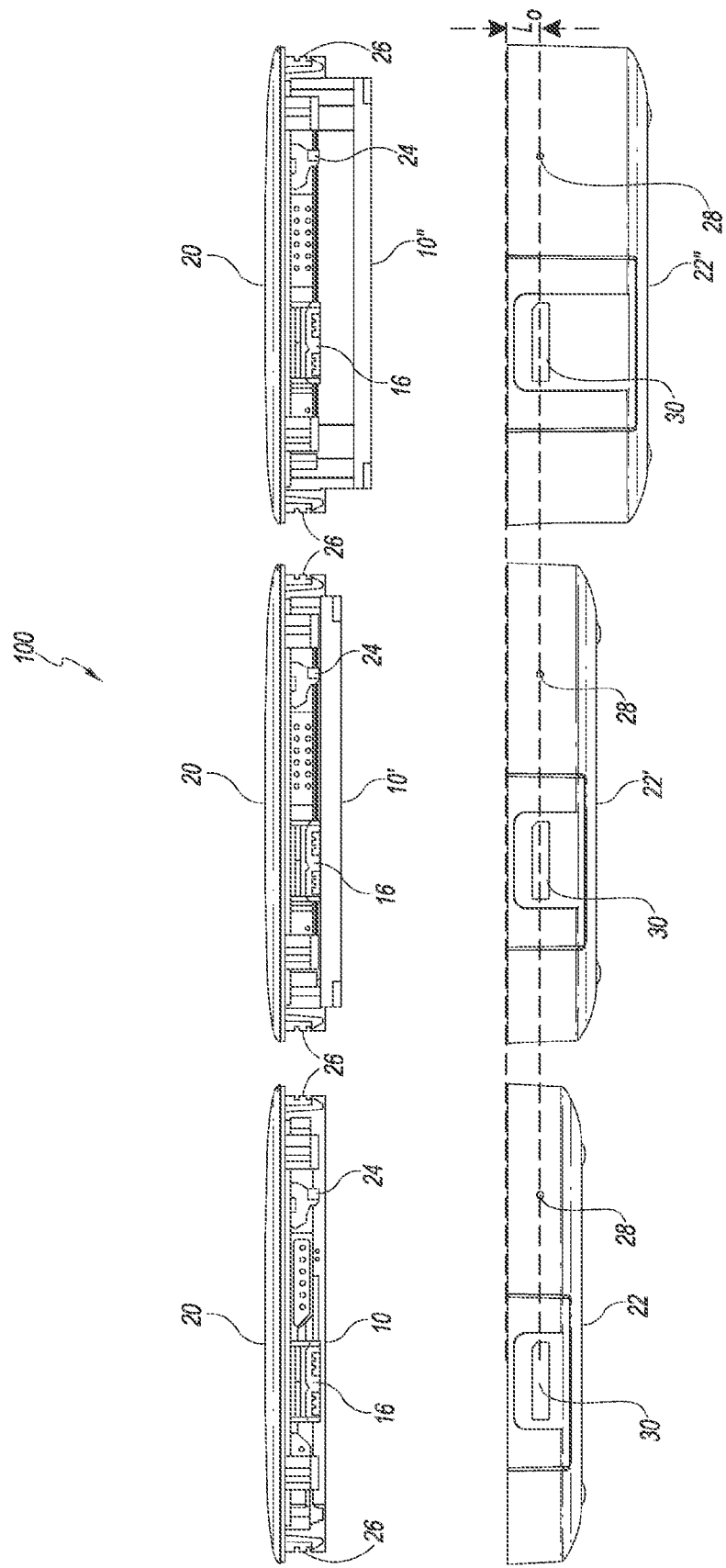
FIGS. 6 and 7 show a plurality of hard disk drives and their corresponding enclosures in respective partially-exploded and assembled conditions.

In FIGS. 5 and 6, the hard drives 10, 10', 10" are shown with the datum plane or bottom of the hard drive in FIGS. 1-4, facing upwards. This is upside down from their more typical orientation. In this manner, the common enclosure part 20 engages the common datum plane. The electrical connector(s) 16, mounting holes 14, indicator light(s) 24 and any other precisely placed components on the hard drive are now precisely located with respect to the common enclosure part 20. In addition, it can be seen that shock mounts 26 are connected to the mounting holes 14 on the hard drives and are also precisely placed with respect to the common datum plane.

Access holes and mounting locations in the enclosure can be located accordingly with respect to the common enclosure part 20. It will be understood that that this can be the case whether the common enclosure part 20 is the top, bottom or middle portion of the enclosure. In addition, the common enclosure part 20 can engage the common datum plane or otherwise be precisely located with respect to the common datum plane.

Figure 7:
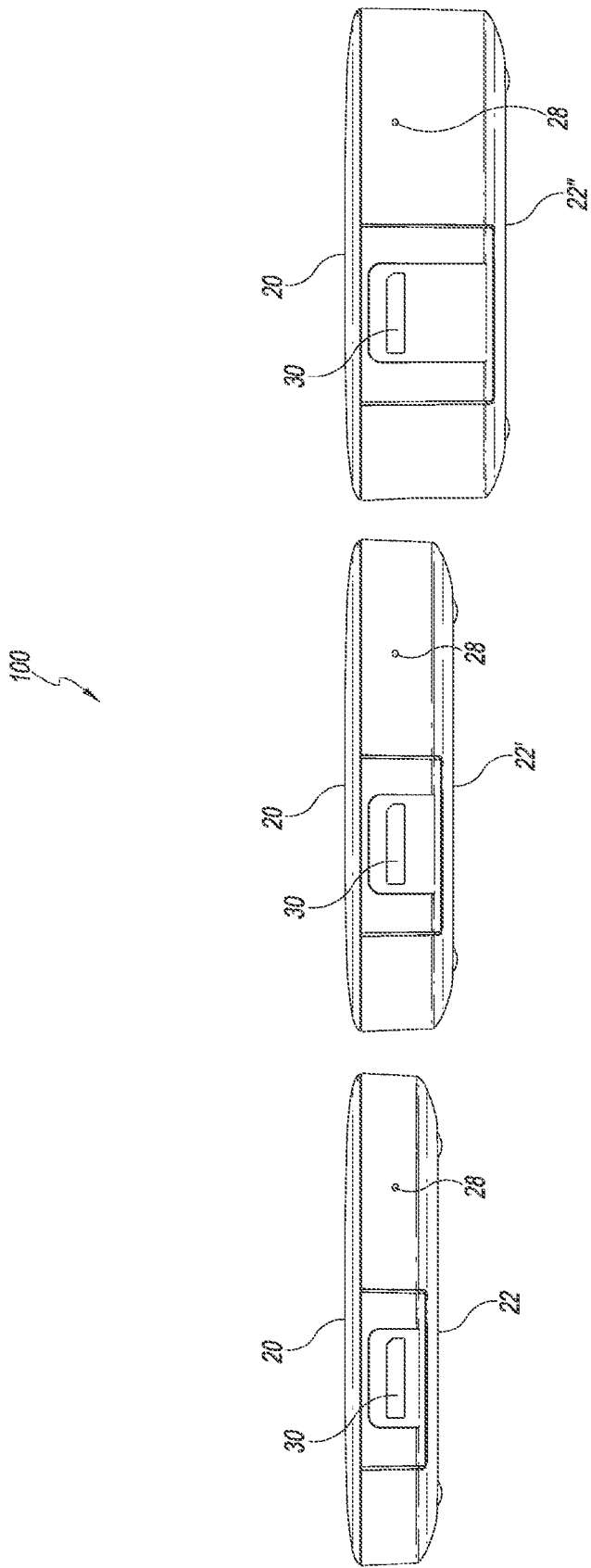

For example, in FIGS. 6 and 7, it can be seen that a hole 28 for the indicator light 24 and an access hole 30 for the USB port 16 can be located at the same location down "$L_O$" from the top of the bottom part 22, 22', 22" of the enclosure. In other embodiments these two holes can be at different locations down from the top while still being consistently placed on different bottom parts 22, 22', 22". In other embodiments, one or more of these features (hole for the indicator light and access hole for the USB port) can be part of the common enclosure part 20.

Figure 8:
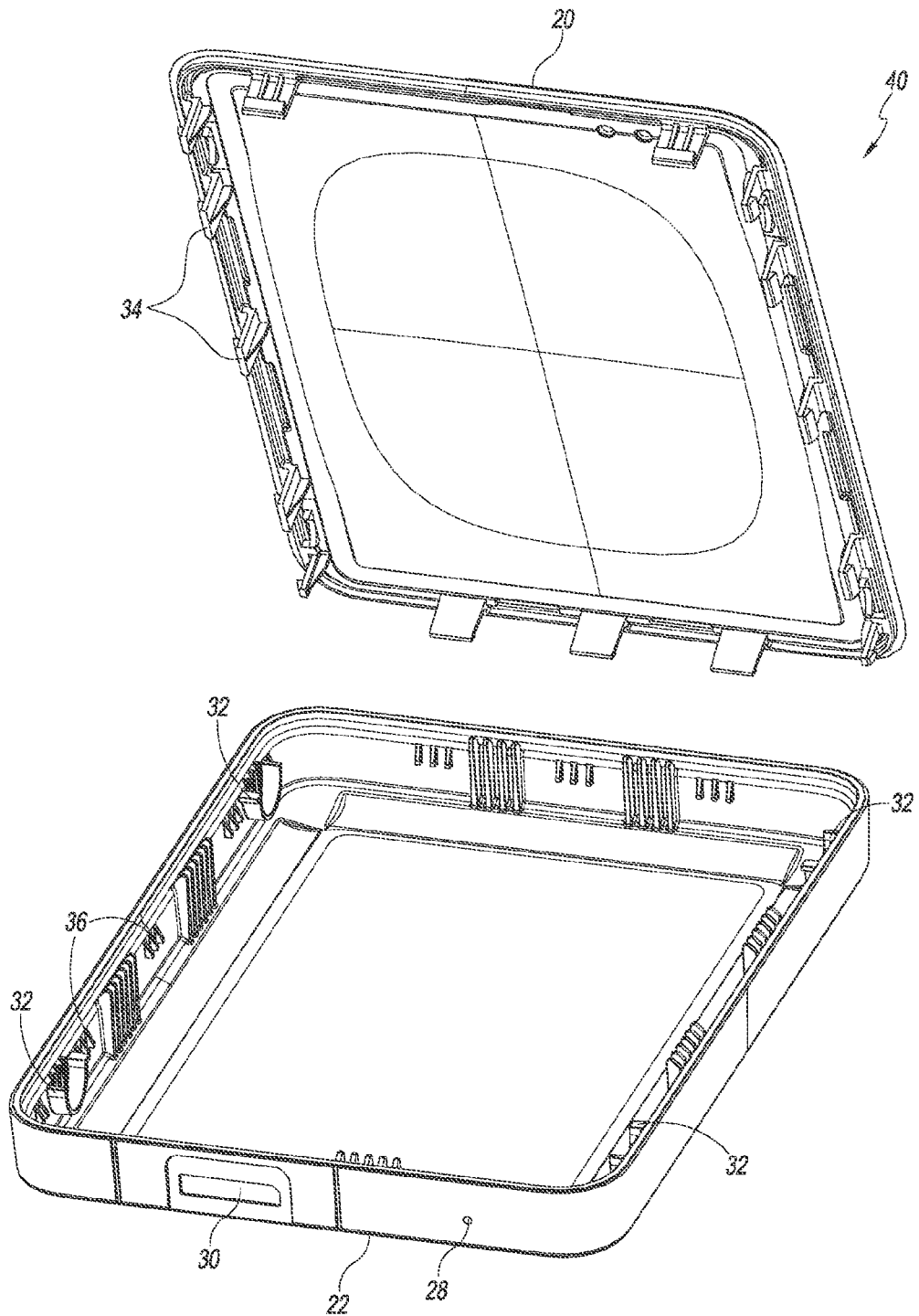
FIG. 8 is an exploded view of an enclosure.

Mounting locations 32 for shock mounts 26 on the hard drives can also be positioned consistently on different bottom parts 22, 22', 22". FIG. 8 illustrates the mounting locations 32 on one of the bottom parts 22 of an enclosure 40. Each mounting location 32 can receive a corresponding shock mount 26.

As can also be seen in FIG. 8, the enclosure can also include connecting features 34, 36 for connecting the top 20 and bottom 22 parts of the enclosure 40. The connecting features 34, 36 can be snap fit members, or other types of connectors. Each of the bottom parts 22, 22', 22" can have connecting features 36 positioned to connect with corresponding connecting features 34 on the common enclosure part 20.

A series of enclosures for different capacity hard drives with a common enclosure part positioned with respect to the common datum plane can locate critical features like USB or SATA connector openings, HDD shock mounting elements and LED indicators. These features can be on the common enclosure part or on a part of varying thickness specific to a particular disk drive. The enclosures can be two-piece enclosures with a common top or bottom.

A common enclosure part can beneficially reduce manufacturing cost while providing size efficient enclosures to house the hard drives. The common enclosure part can reduce the overall cost of manufacturing the assembly as it increases the number of components that are independent of the hard drive specifics. Thus, the common enclosure part and can be used across different capacity and/or thickness hard drives with the same or different sized disks or with different types of storage drives. In this way, the enclosure can be the smallest enclosure thickness while decreasing the amount of tooling cost.

It will be understood that though the enclosure system has been described primarily with reference to hard drives of the same sized (diameter) disks having different thicknesses and/or storage capacities, use of the enclosure system is not restricted to only this scenario. For example, the enclosure system can also be used with storage drives that are the same thickness and/or capacity, but different numbers of storage drives can be contained within each enclosure. Thus, a first enclosure may include a single storage drive and a second enclosure may include two or more of the same type, size and thickness of storage drives. In addition, the enclosure system with the common enclosure part can be used across different storage platforms, such as to reduce cost over multiple product lines.

In some embodiments, an enclosure system can be used for separately housing one of two storage devices having different thicknesses. A first portion can be interchangeable with both storage devices. Second and third portions can each have a thickness to size efficiently accommodate the thickness of one storage device. Each of the second and third portions has an engagement surface to engage the first portion forming an enclosure. Either the first portion, or both second and third portions can comprise an opening or a shock mounting element. When the opening or the shock mounting element are on both the second and third portions, the opening or the shock mounting element is collectively identically spaced from the engagement surface on both the second and third portions.

In some embodiments, an enclosure system can be used for housing one of a first plurality of hard drives having a first thickness or a second plurality of hard drives having a second thickness different from the first. The enclosure system can comprise a first portion configured to engage a reference surface of the hard drive to be housed in the enclosure, of either the first or second pluralities of hard drives, and a second portion having a thickness selected to accommodate the thickness of the hard drive to be housed in the enclosure. The second portion can comprise one of 2 different second portions—a first-second portion and a second-second portion. The first-second portion can have a thickness to accommodate a hard drive of the first plurality of hard drives and the second-second portion can have a thickness to accommodate a hard drive of the second plurality of hard drives. The second portion can have an engagement surface configured to engage the first portion, the second portion with a connector opening, shock mount elements, and optionally an LED indicator consistently located from the engagement surface across the first-second portions and the second-second portions. The first portion can be common to each hard drive regardless of hard drive thickness. In some embodiments, the first portion is the top portion of the enclosure, while in other embodiments it is the bottom portion of the enclosure.

The enclosure system can also be used to house one of a third plurality of hard drives having a third thickness different from both the first and second thicknesses. A third-second portion can have a thickness to accommodate a hard drive of the third plurality of hard drives.

According to certain embodiments, an enclosure can be used for housing one of a first plurality of hard drives having a first thickness or a second plurality of hard drives having a second thickness different from the first. The enclosure can comprise a first portion that locates a connector opening, shock mount elements, and optionally an LED indicator, and a second portion having a thickness selected to accommodate the thickness of the hard drive to be housed in the enclosure. The first portion can be common to each hard drive regardless of hard drive thickness. In some embodiments, the first portion is the top portion of the enclosure, while in other embodiments it is the bottom portion of the enclosure.

In some embodiments, an enclosure system can be used for housing one of a first plurality of hard drives having a first thickness or a second plurality of hard drives having a second thickness different from the first. The enclosure system can comprise a first portion and a second portion. The first portion can be configured to engage a reference surface of a hard drive for housing within the enclosure, of either the first or second pluralities of hard drives. The second portion can have a thickness selected to accommodate the thickness of the hard drive to be housed in the enclosure. The second portion can comprise one of a first-second portion and a second-second portion. The first-second portion can have a thickness to accommodate a hard drive of the first plurality of hard drives and the second-second portion can have a thickness to accommodate a hard drive of the second plurality of hard drives. The second portion can have an engagement surface configured to engage the first portion. The second portion can comprise one or more of a connector opening, shock mount elements, and optionally an LED indicator, each consistently located from the engagement surface across the first-second portions and the second-second portions. The first portion can be common to each hard drive regardless of hard drive thickness.

An enclosure system in some embodiments can be used for separately housing one of a first plurality of storage devices having a first thickness and one of a second plurality of storage devices having a second thickness different from the first thickness. The enclosure system can comprise a first portion, a second portion, and a third portion. The first portion can be configured to engage a reference surface of a storage device for housing within an enclosure, the first portion being interchangeable with both the first and second pluralities of storage devices. The second portion can have a third thickness to accommodate the first thickness of storage device of the first plurality of storage devices. The third portion can have a fourth thickness to accommodate the second thickness of storage device of the second plurality of storage devices, the fourth thickness being different from the third thickness. Each of the second and third portions can comprise an engagement surface configured to engage the first portion to form an enclosure to house a storage device, an electrical connector opening, and shock mounting elements comprising either shock mounts or shock mount receiving elements. The electrical connector opening and the shock mounting elements can be collectively identically spaced from the engagement surface on both the second portion and the third portion.

In some embodiments of the enclosure system the first portion is the top portion of the enclosure. Each of the second and third portions may further comprise an indicator light opening, the indicator light opening identically spaced from the engagement surface on both the second portion and the third portion. A fourth portion can have a fifth thickness to accommodate a storage device of a third plurality of storage devices, the fifth thickness being different from both the third and fourth thicknesses. The fourth portion, similar to the second and third portions, can also include an engagement surface, an electrical connector opening, and shock mounting elements, the electrical connector opening and the shock mounting elements being collectively identically spaced from the engagement surface on the second, third, and fourth portions.

In some embodiments, an enclosure system can be used for separately housing one of a first plurality of storage devices having a first thickness and one of a second plurality of storage devices having a second thickness different from the first thickness. The enclosure system can comprise first, second and third portions. The first portion can be configured to engage a reference surface of a storage device for housing within an enclosure, the first portion being interchangeable with both the first and second pluralities of storage devices. The second portion can have a third thickness to accommodate the first thickness of storage device of the first plurality of storage devices. The third portion can have a fourth thickness to accommodate the second thickness of storage device of the second plurality of storage devices, the fourth thickness being different from the third thickness, each of the second and third portions comprising an engagement surface configured to engage the first portion to form an enclosure to house a storage device. Either the first portion, or both the second and third portions can comprise at least one electrical connector opening; and at least one shock mounting element comprising either at least one shock mount or shock mount receiving element; wherein, when the at least one electrical connector opening and the at least one shock mounting element are on both the second and third portions, the at least one electrical connector opening and the at least one shock mounting element are collectively identically spaced from the engagement surface on both the second portion and the third portion.

The first portion may further comprise an indicator light opening, and the at least one electrical connector opening and the at least one shock mounting element are on the first portion. Each of the second and third portions can further comprise an indicator light opening, the indicator light opening identically spaced from the engagement surface on both the second portion and the third portion.

According to certain embodiments, a manufacturing method can be used for assembling a storage drive. The method can include one or more of the following steps. Selecting a hard disk drive from among a first group and a second group, the first group having a first thickness that is different from a second thickness of the second group. Selecting an enclosure to house the hard disk drive, the enclosure having a first part and a second part, the first part being compatible with both of the first and second groups of hard disk drives and the second part having a thickness specific to the selected hard disk drive of the first and second groups of hard disk drives. Selecting an enclosure can further comprise selecting a second part from among a third group and a fourth group, the third group having a third thickness and the fourth group having a fourth thickness different from the third thickness. Assembling the storage drive by placing the hard disk drive within one of the parts of the enclosure and connecting the first and second parts of the enclosure. The enclosure can comprise an electrical connector opening, and shock mounting elements comprising either shock mounts or shock mount receiving elements. The electrical connector opening and shock mounting elements can be positioned on either the first part or the second part, when on the second part being collectively identically spaced from an engagement surface on the second part of both the third group and the fourth group, the engagement surface configured to engage the first part to form the enclosure.

In some methods each hard disk drive of the first group can have a first storage capacity different from the second group. Selecting a hard disk drive can further comprise selecting a hard disk drive from among the first group, the second group, and a third group, the third group having a storage capacity and/or thickness different from that of the first and second groups.

A manufacturing method for assembling a storage drive according to some embodiments can be provided. The method can include one or more of the following steps. Selecting a hard disk drive from either a first group or a second group (or optionally a third group). The first group having a first storage capacity and/or thickness that is different from the second group. Selecting an enclosure to house the hard disk drive, the enclosure having a first part and a second part. The first part being compatible with both of the first and second groups of hard disk drives and the second part having a thickness specific to the selected hard disk drive of the first and second groups of hard disk drives. Assembling the storage drive by placing the hard disk drive within one of the parts of the enclosure and connecting the first and second parts of the enclosure.

Each hard disk drive having a reference datum plane from which an electrical connector and mounting holes are measured. The distances being the same between the first group and the second group. The first part engaged with the reference datum plane in the assembled state such that the electrical connector and mounting holes are in the same relative position with respect to the first part independent of whether the disk drive is from the first group or the second group.

The described enclosures and methods provide many advantages and benefits. This invention provides the most size efficient HDD enclosures with the least amount of tooling cost. It meets the need of the smallest HDD enclosure for the customer without size specific tooling thus removing a large cost burden (from tooling) to the product resulting in better profit margins.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above.

What is claimed is:

1. An enclosure system for separately housing one of a first plurality of storage devices having a first thickness and one of a second plurality of storage devices having a second thickness different from the first thickness, the enclosure system comprising:
    a first portion configured to engage a reference surface of a storage device for housing within an enclosure, the first portion being interchangeable with both the first and second pluralities of storage devices;
    a second portion having a third thickness to accommodate the first thickness of storage device of the first plurality of storage devices; and
    a third portion having a fourth thickness to accommodate the second thickness of storage device of the second plurality of storage devices, the fourth thickness being different from the third thickness;
    wherein each of the second and third portions comprise:
        an engagement surface configured to engage the first portion to form an enclosure to house a storage device;
        an electrical connector opening; and
        shock mounting elements comprising either shock mounts or shock mount receiving elements;
    wherein the electrical connector opening and the shock mounting elements are collectively identically spaced from the engagement surface on both the second portion and the third portion.

2. The enclosure system of claim 1, wherein the first portion is the top portion of the enclosure.

3. The enclosure system of claim 1, wherein each of the second and third portions further comprising an indicator light opening, the indicator light opening identically spaced from the engagement surface on both the second portion and the third portion.

4. The enclosure system of claim 1, further comprising a fourth portion having a fifth thickness to accommodate a storage device of a third plurality of storage devices, the fifth thickness being different from both the third and fourth thicknesses.

5. The enclosure system of claim 4, wherein the fourth portion, similar to the second and third portions, also comprises an engagement surface, an electrical connector opening, and shock mounting elements, the electrical connector opening and the shock mounting elements being collectively identically spaced from the engagement surface on the second, third, and fourth portions.

6. The enclosure system of claim 1, wherein the first portion comprises a first snap-fit member and each of the second and third portions comprise a corresponding second snap-fit member configured to engage with the first snap-fit member to form a snap-fit connection.

7. The enclosure system of claim 1, comprising one of the first plurality of storage devices positioned within the first portion and the second portion.

8. An enclosure system for separately housing one of a first plurality of storage devices having a first thickness and one of a second plurality of storage devices having a second thickness different from the first thickness, the enclosure system comprising:
    a first portion configured to engage a reference surface of a storage device for housing within an enclosure, the first portion being interchangeable with both the first and second pluralities of storage devices;
    a second portion having a third thickness to accommodate the first thickness of storage device of the first plurality of storage devices; and
    a third portion having a fourth thickness to accommodate the second thickness of storage device of the second plurality of storage devices, the fourth thickness being different from the third thickness, each of the second and third portions comprising an engagement surface configured to engage the first portion to form an enclosure to house a storage device;
    wherein either the first portion, or both the second and third portions comprise:
        at least one electrical connector opening; and
        at least one shock mounting element comprising either at least one shock mount or shock mount receiving element;
    wherein, when the at least one electrical connector opening and the at least one shock mounting element are on both the second and third portions, the at least one electrical connector opening and the at least one shock mounting element are collectively identically spaced from the engagement surface on both the second portion and the third portion.

9. The enclosure system of claim 8, wherein the first portion is the top portion of the enclosure.

10. The enclosure system of claim 8, wherein the first portion further comprises an indicator light opening, and the at least one electrical connector opening and the at least one shock mounting element are on the first portion.

11. The enclosure system of claim 8, wherein each of the second and third portions further comprising an indicator light opening, the indicator light opening identically spaced from the engagement surface on both the second portion and the third portion.

12. The enclosure system of claim 8, further comprising a fourth portion having a fifth thickness to accommodate a storage device of a third plurality of storage devices, the fifth thickness being different from both the third and fourth thicknesses.

13. The enclosure system of claim 8, wherein the first portion comprises a first snap-fit member and each of the second and third portions comprise a corresponding second snap-fit member configured to engage with the first snap-fit member to form a snap-fit connection.

14. The enclosure system of claim 8, comprising one of the first plurality of storage devices positioned within the first portion and the second portion.

15. A manufacturing method for assembling a storage drive comprising:
   selecting a hard disk drive from among a first group and a second group, the first group having a first thickness that is different from a second thickness of the second group;
   selecting an enclosure to house the hard disk drive, the enclosure having a first part and a second part, the first part being compatible with both of the first and second groups of hard disk drives and the second part having a thickness specific to the selected hard disk drive of the first and second groups of hard disk drives, selecting an enclosure further comprising:
      selecting a second part from among a third group and a fourth group, the third group having a third thickness and the fourth group having a fourth thickness different from the third thickness; and
   assembling the storage drive by placing the hard disk drive within one of the parts of the enclosure and connecting the first and second parts of the enclosure, the enclosure comprising:
      an electrical connector opening; and
      shock mounting elements comprising either shock mounts or shock mount receiving elements;
   wherein, the electrical connector opening and shock mounting elements are positioned on either the first part or the second part, when on the second part being collectively identically spaced from an engagement surface on the second part of both the third group and the fourth group, the engagement surface configured to engage the first part to form the enclosure.

16. The manufacturing method of claim 15, wherein each hard disk drive of the first group having a first storage capacity different from the second group.

17. The manufacturing method of claim 15, wherein selecting a hard disk drive further comprises selecting a hard disk drive from among the first group, the second group, and a third group, the third group having a storage capacity and/or thickness different from that of the first and second groups.

\* \* \* \* \*